US009019998B1

(12) United States Patent
Qureshi

(10) Patent No.: US 9,019,998 B1
(45) Date of Patent: Apr. 28, 2015

(54) TUNABLE FIBER RING LASER WITH A GAIN CLAMPED SEMICONDUCTOR OPTICAL AMPLIFIER

(71) Applicant: King Fahd University of Petroleum and Minerals, Dhahran (SA)

(72) Inventor: Khurram Karim Qureshi, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/243,012

(22) Filed: Apr. 2, 2014

(51) Int. Cl.
H01S 3/30 (2006.01)
H01S 3/10 (2006.01)
H01S 3/083 (2006.01)
H01S 5/10 (2006.01)
H01S 5/062 (2006.01)
H01S 5/50 (2006.01)

(52) U.S. Cl.
CPC .............. *H01S 5/1071* (2013.01); *H01S 5/062* (2013.01); *H01S 5/5045* (2013.01)

(58) Field of Classification Search
USPC .................................................. 372/6, 20, 94
See application file for complete search history.

(56) References Cited

U.S. PATENT DOCUMENTS

| 6,134,250 | A | 10/2000 | Koren et al. |
| 7,081,990 | B2 | 7/2006 | Michie et al. |
| 7,376,167 | B2 | 5/2008 | Yu |
| 8,315,281 | B2 | 11/2012 | Lin et al. |
| 2006/0222038 | A1 | 10/2006 | Yamazaki |

FOREIGN PATENT DOCUMENTS

CN 101191972 B 9/2010

OTHER PUBLICATIONS

U.S. Appl. No. 13/771,054, filed Feb. 19, 2013, Khurram Karim Qureshi.
Qureshi, Khurram Karim, Tam, H. Y, "Multiwavelength fiber ring laser using a gain clamped semiconductor optical amplifier," Optics & Laser Technology, 44, 1646-1648, Feb. 25, 2012.
Liu, Lin, Michie C., Kelly, A., Andonovic, I., "Detailed Theoretical Model for Adjustable Gain-Clamped Semiconductor Optical Amplifier," International Journal of Optics, vol. 2012, Hindawi Publishing Corporation, 6 pages, 2012.
Michie, C., Kelly A. E., Armstrong, I., Andonovic, I. Tombling, C., An Adjustable Gain-Clamped Semiconductor Optical Amplifier (AGC-SOA), Journal of Lightwave Technology, vol. 25, No. 6, pp. 1466-1473, Jun. 2007.
Qureshi, K.K., Tam, H.Y., "Linear optical amplifier-based semiconductor fiber ring laser with 93-nm tuning range,"Microw. Opt. Technol. Lett., vol. 50, No. 6, pp. 1702-1704, Jun. 2008.

(Continued)

*Primary Examiner* — Armando Rodriguez
(74) *Attorney, Agent, or Firm* — Richard C Litman

(57) ABSTRACT

A tunable fiber ring laser with a gain clamped semiconductor optical amplifier is a ring laser source working at room temperature. The laser has an inner cavity disposed inside an outer cavity. A pair of circulators disposed in the inner cavity is configured to assure counter-propagation of light between the inner cavity and the outer cavity. A gain-clamped semiconductor optical amplifier (GC-SOA) is formed by combining a semiconductor optical amplifier (SOA) and a fixed filter in conjunction with the pair of circulators. A Fiber Fabry-Perot Tunable Filter (FFP-TF) is disposed in the outer cavity and connects to the pair of circulators via a polarization controller and a fused coupler.

20 Claims, 5 Drawing Sheets

(56) References Cited

OTHER PUBLICATIONS

O'Riordan, C., Connelly, M.J., "Repetition rate and wavelength tunable all-optically mode-locked fiber ring laser based on a reflective semiconductor optical amplifier," 2010 7th International Symposium on Communication Systems, Networks and Digital Signal Processing, pp. 670-673, Jul. 21-23, 2010.

Sookyoung Roh, Seunghwan Chung, Yong Wook Lee, Ilyong Yoon, Byoungho Lee, "Channel-Spacing—and Wavelength-Tunable Multiwavelength Fiber Ring Laser Using Semiconductor Optical Amplifier," Photonics Technology Letters, IEEE, vol. 18, No. 21, pp. 2302-2304, Nov. 1, 2006.

Zhou, D., Prucnal, P.R., Glesk, I., "A widely tunable narrow linewidth semiconductor fiber ring laser," Photonics Technology Letters, IEEE, vol. 10, No. 6, pp. 781-783, Jun. 1998.

Qureshi, Khurram Karim, Tam, H. Y., Lu, C., Wai P. K. A., "Gain Control of Semiconductor Optical Amplifier Using a Bandpass Filter in a Feedback Loop," IEEE Photonics Technology Letters, vol. 19, No. 18, Sep. 15, 2007, pp. 1401-1403.

Qureshi, Khurram Karim, "A broadly tunable fiber ring laser employing a gain-clamped semiconductor optical amplifier," Laser Phys., vol. 23, No. 7, Jun. 10, 2013, pp. 1-3.

US 9,019,998 B1

TUNABLE FIBER RING LASER WITH A GAIN CLAMPED SEMICONDUCTOR OPTICAL AMPLIFIER

BACKGROUND OF THE INVENTION

1. Field of the Invention

The present invention relates to optical laser technology, and particularly to a tunable fiber ring laser with a gain clamped semiconductor optical amplifier configured to provide stable tunable-lasing over a relatively wide lasing wavelength.

2. Description of the Related Art

Tunable fiber ring lasers have found a lot of attention recently for many applications. They are widely used in wavelength division multiplexing (WDM) communication systems, laser spectroscopy and fiber optic sensor systems. The advantage offered by these laser sources is that their emission lasing wavelength can be easily tuned in a certain spectral range using different techniques. This feature can be of importance, whereby a single source can replace several laser sources. Also, erbium doped fibers (EDF) have been used as the gain medium reported using tunable fiber Bragg gratings (TFBG) for wavelength tuning in the C-band. The gratings are embedded inside a 3-point bending device for achieving wavelength tuning. The laser is tunable from 1530 nanometers (nm) to 1565 nm. Other known designs include a mode restricting intra-cavity fiber Fabry-Perot (FP) filter in the EDF based ring laser. Such a laser operates from 1533.3 nm to 1574.6 nm. The laser is predominantly tunable in the C-band than in the L-band. Further, a widely tunable erbium doped fiber ring laser based on multimode interference effect is known and is tunable from 1549 nm to 1609 nm, where tuning is more pronounced in the L-band than in the C-band. Also, a semiconductor based linear optical amplifier used as the gain medium is known, and the laser is tunable from 1507 nm to 1600 nm. Further, it is known that a tuning wavelength of 80 nm can be achieved by varying the length of the EDF in the cavity, and that the EDF length is varied from 50 m to 200 m in order to achieve a tuning range of 80 nm. Additionally, a tunable fiber ring laser is known based on a two-taper Mach Zehnder interferometer, and the laser is tuned by mechanically bending one of the two taper waists. The tuning range in the L-band is from 1564 nm-1605 nm, which was achieved by employing an L band erbium doped fiber amplifier (EDFA) in the cavity. Also, a micro-electro-mechanical system (MEMS) based in-plane FP filter has been used to demonstrate a tuning range of 35 nm in the C-band. An advantage offered by semiconductor optical amplifier based lasers is their compact size, such as when compared to their EDF based counterpart.

Thus, a tunable fiber ring laser with a gain clamped semiconductor optical amplifier addressing the aforementioned problems is desired.

SUMMARY OF THE INVENTION

Embodiments of a tunable fiber ring laser with a gain clamped semiconductor optical amplifier can provide a widely tunable semiconductor fiber ring laser based on a gain clamped semiconductor optical amplifier working at room temperature. By incorporating embodiments of a gain clamped semiconductor optical amplifier (SOA) as a gain medium, the laser can be tuned from around 1522 nm to around 1599 nm, for example. Embodiments of a tunable fiber ring laser have an inner cavity disposed in an outer cavity. A pair of circulators is disposed in the inner cavity and is configured to provide a counter-propagation of light between the inner cavity and the outer cavity. Embodiments of a gain-clamped semiconductor optical amplifier (GC-SOA) are formed by combining a semiconductor optical amplifier (SOA) and a fixed filter where the circulator pair is inside the inner cavity. This configuration in the laser cavity can provide an improvement in terms of transient gain excursions by applying optical feedback in the tunable fiber ring laser. This attribute of the GC-SOA can enable realizing a stable or substantially stable tunable-wavelength laser source. The fiber Fabry-Perot tunable filter (FFP-TF) in embodiments of a tunable fiber ring laser is configured in the outer cavity to act as a wavelength selective element to selectively tune the laser wavelength of the tunable fiber ring laser. Embodiments of a tunable fiber ring laser are continuously or substantially continuously tunable over a 78 nanometer (nm) range of the C-band and the L-band, for example. Also, embodiments of a tunable fiber ring laser can produce a power equalized output from 1530 nm to up to 1570 nm with a side-mode-suppression ratio (SMSR) of greater than 60 dB, for example.

These and other features of the present invention will become readily apparent upon further review of the following specification and drawings.

BRIEF DESCRIPTION OF THE DRAWINGS

Unless otherwise indicated, similar reference characters denote corresponding features consistently throughout the attached drawings.

DETAILED DESCRIPTION OF THE PREFERRED EMBODIMENTS

Figure 1:
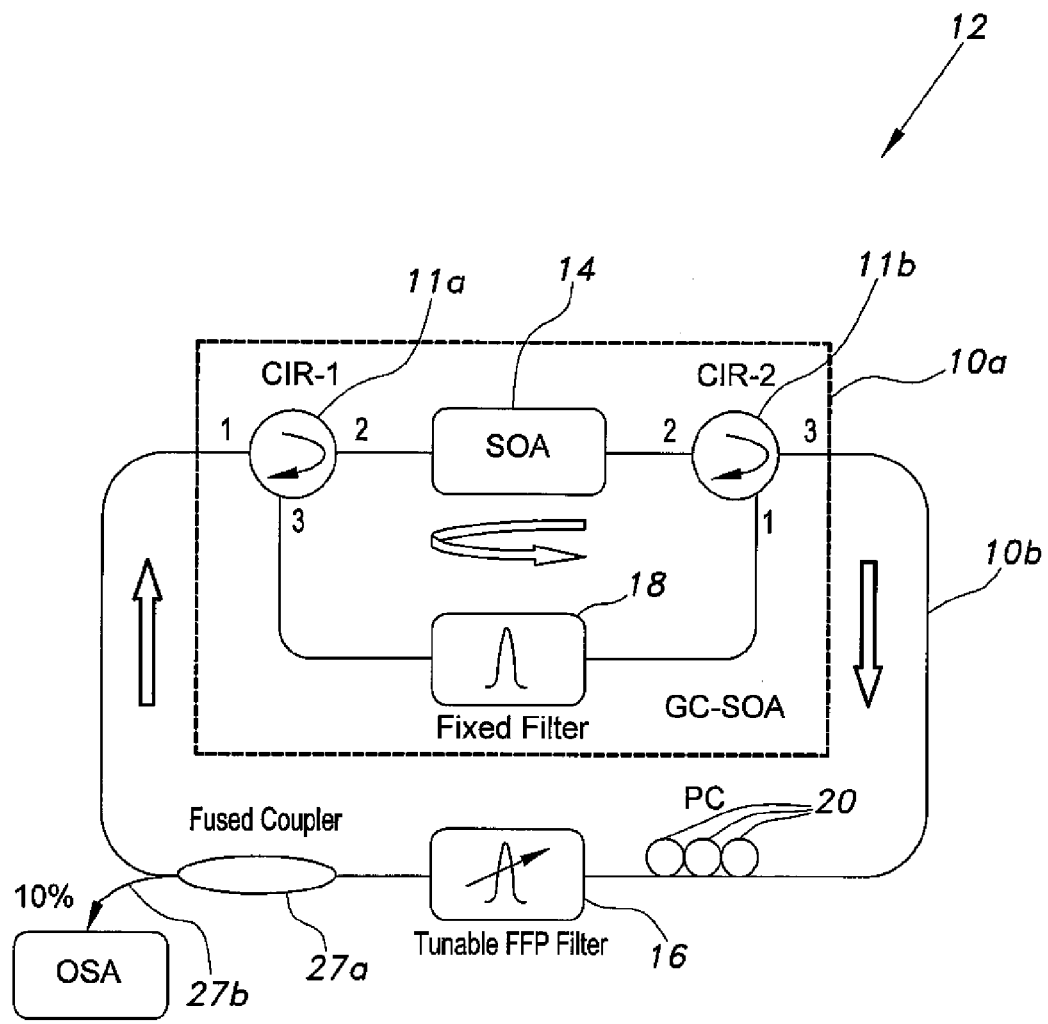
FIG. 1 is a block diagram of an embodiment of a GC-SOA equipped tunable fiber ring laser according to the present invention.

The schematic diagram of FIG. 1 shows an embodiment of a tunable fiber ring laser 12 in an experimental setup as can be used to demonstrate the operation of the widely tunable semiconductor fiber ring laser 12 at room temperature, for example. Embodiments of a tunable fiber ring laser, such as the tunable semiconductor fiber ring laser 12 have a gain-clamped semiconductor optical amplifier (GC-SOA) including a SOA 14 formed inside an inner cavity 10a which acts as a gain medium. The tunable semiconductor fiber ring laser 12 laser source has two cavities, for example. The inner cavity 10a, as an inner short cavity, is incorporated to provide an optical feedback to realize the GC-SOA, whereas the outer cavity 10b serves as the main cavity of the laser source. The SOA 14 is incorporated in the tunable semiconductor fiber ring laser 12 setup to realize the GC-SOA within the inner cavity 10a of the tunable semiconductor fiber ring laser 12.

A polarization controller (PC) 20 in a main outer cavity 10b, as an outer long cavity, of the tunable semiconductor fiber ring laser 12 adjusts the state of polarization in the laser cavity to achieve a relatively high signal-to-noise ratio (SNR) and to achieve a relatively stable output power.

A fiber Fabry-Perot Tunable Filter (FFP-TF) 16, desirably a thin filmed filter, for example, is included in the main outer cavity 10b in-line between the PC 20 and a fused 90/10 coupler having a 90% pass through 27a and a 10% diverter 27b. The FFP-TF 16 provides a feedback light beam and acts as a wavelength selective element in the tunable fiber ring laser 12 to selectively tune the laser wavelength of the tunable fiber ring laser 12. The tuning of the laser wavelength is achieved by tuning the pass-band of the FFP-TF 16 employed in the main outer cavity 10b.

The direction of the feedback light beam in the inner cavity 10a is established by the two circulators 11a and 11b. The light in the inner cavity 10 as cavity circulates in a counter-clockwise direction, or in a counter-propagating direction, as indicated by the curved arrow underneath the SOA 14 in FIG. 1. The light beam in the main outer cavity 10b circulates in the clockwise direction, as indicated by the linear arrows inside main outer cavity 10b in FIG. 1. The two circulators 11a and 11b in the GC-SOA determine or establish the direction of feedback light, such as a feedback light beam, as well as enhance avoiding unwanted reflections from the tunable filter FFP-TF 16 to the SOA 14.

A fixed filter 18 in the feedback loop can have a 3 decibel (dB) bandwidth of 0.025 nm and can be fixed at around 1532 nm, for example, which can enhance providing a relatively fine gain control. The fixed filter 18 and the SOA 14 is operably connected to the pair of circulators 11a and 11b within the inner cavity 10a, the fixed filter 18 providing a feedback path and combined with the SOA 14 forming a gain-clamped semiconductor optical amplifier (GC-SOA) in the tunable fiber ring laser 12 having an optical output directing first optical signals to the main outer cavity 10b and an optical input accepting second optical signals from the main outer cavity 10b.

In a GC-SOA, such as in the tunable semiconductor fiber ring laser 12, the induced lasing oscillations can clamp the gain and can suppress the gain saturation. This effect can reduce the gain-competition among the lasing modes, for example. The main outer laser cavity 10b includes the GC-SOA, the polarization controller PC 20, the FFP-TF 16, such as from Micron Optics Co., and the 10% fused coupler 27a, 27b. The PC 20 is useful in achieving an optimized polarization state inside the main outer cavity 10b to achieve a relatively stable output power. The 10% fused coupler 27a, 27b is used to tap the output from the laser, the 10% light being directed to an optical spectrum analyzer (OSA), such as illustrated in FIG. 1, for example.

The resonator design in embodiments of the tunable semiconductor fiber ring laser 12 can provide a positive feedback, for example. A first portion of the split output from the optical coupler, such as the fused coupler 27a, 27b, provides a tunable wavelength coherent beam emitted from the tunable fiber ring laser 12, and a second portion of the split output includes optical signals retained in the inner cavity 10a and the main outer cavity 10b via a second circulator of the pair of circulators 11a, 11b.

In the tunable semiconductor fiber ring laser 12, the gain-clamped semiconductor optical amplifier (GC-SOA) includes the SOA 14 driven by a laser diode driver at a biasing current of approximately 200 milli-amperes (mA), for example. The SOA 14 can offer a relatively small signal gain of 25 dB with a saturation output power of 11.2 decibels-milli-watt (dBm), for example. The gain ripple of the SOA 14 is less than 0.2 dB and the gain difference between the transverse-electric (TE) and the transverse-magnetic (TM) polarization is less than 1 dB, for example. The average noise figure (NF) of the SOA 14 is around 6.64 dB. Gain clamping is achieved in the tunable semiconductor fiber ring laser 12 by the introduction of a feedback light beam realized by employing a narrow line-width tunable filter, such as the FFP-TF 16, and the two 3-port fiber circulators 11a and 11b in the loop.

The direction of feedback light beam in the GC-SOA is established by the two circulators 11a and 11b. Ports 2 of the circulators 11a and 11b are connected to the OSA 14. Port 3 of the circulator 11a is connected to input of the fixed filter 18. Output of the fixed filter 18 is connected to port 1 of the circulator 11b. Port 3 of the circulator 11b is connected in the main outer cavity 10b to the polarization controller, such as the PC 20, which is connected to the tunable FFP filter, such as the FFP-TF 16, the output of which feeds the fused coupler 27a, 27b having split feedback path 27a and diverter path 27b. The 90% path output from the fused coupler 27a, 27b is connected to port 1 of the circulator 11a to complete the circuit in the tunable semiconductor fiber ring laser 12. The tunable filter FFP-TF 16 facilitates a continuous or substantially continuous tuning of the tunable fiber ring laser 12 in the wavelength range from 1522 nm to around 1599 nm to 1600 nm, for example.

The feedback light in the tunable fiber ring laser 12 operates in a counter-propagating direction to the main outer cavity 10. The two circulators 11a, 11b in the GC-SOA determine the direction of feedback light, as well as enhance avoiding unwanted reflections from the tunable filter, such as the FFP-TF 16, to the SOA 14. The fixed filter 18 in the feedback loop can have a 3 dB bandwidth of 0.025 nm and can be fixed at around 1532 nm which can enhance providing a relatively fine gain control, for example. Also, it is known that in a GC-SOA the induced lasing oscillations can clamp the gain and can suppress the gain saturation, as can reduce gain-competition among lasing modes, for example.

Figure 2:
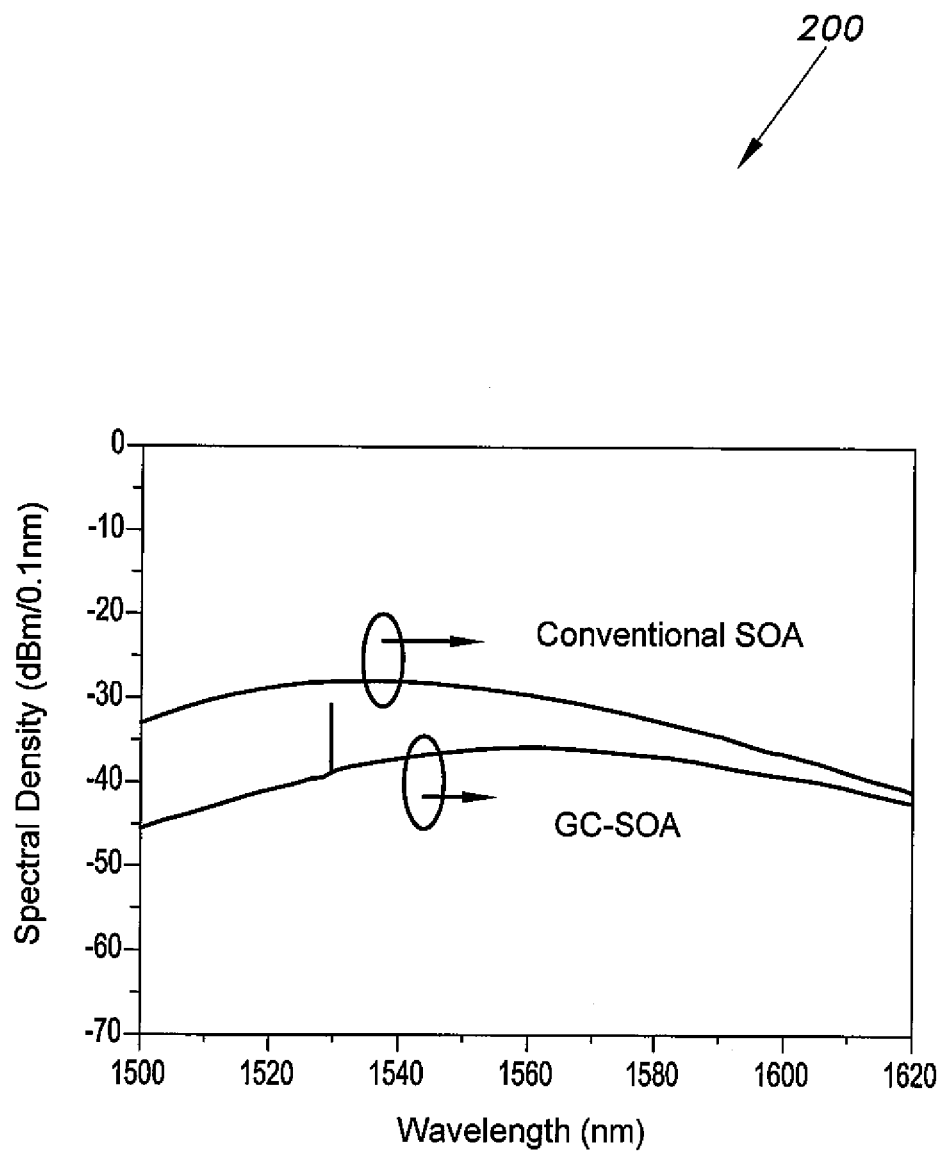
FIG. 2 is a wavelength comparison plot of an embodiment of a GC-SOA versus a conventional SOA.

Referring now to FIG. 2, plot 200 of FIG. 2 shows the amplified spontaneous emission (ASE) spectrum of a conventional SOA and a GC-SOA in an embodiment of a tunable fiber ring laser, such as the tunable fiber ring laser 12, at a fixed biasing current of 200 mA. The ASE peak wavelength of the SOA is at around 1526 nm which is shifted to 1560 nm when a GC-SOA is used. The feedback light beam at 1532 nm is also observed in FIG. 2. The 3 dB spectral width of the conventional SOA is around 55 nm which is extended to around 65 nm in the case of a GC-SOA. This extended spectral width can enable achieving a broadband tunable laser covering the whole or substantially the whole C-band and the L-band, for example.

Continuing with reference to FIG. 2, a narrow band, wide tunable range FFP-TF from the Micron Optics Co, such as the tunable FFP-TF 16, was employed in the main outer cavity 10b to tune the lasing wavelength. By varying the voltage applied to the tunable filter, such as the tunable FFP-TF 16, the tunable fiber ring laser, such as the tunable fiber ring laser 12, was tuned over the C- and the L-band. The operable temperature range of the FFP-TF 16 is from −20 to +80 degrees centigrade (C) and its tuning Voltage/Free-Spectral-Range (FSR) is in a range of from approximately 0 volts to 16 volts, for example. The optical 3-bandwidth of the tunable filter FFP-TF 16 is 30 petameters (pm) (3.75 gigahertz (GHz)) and its FSR is around 102 nm, hence the Finesse of the FFP-TF 16 is 3400, for example. Also, the insertion loss at the peak of its pass-band is about 2.2 dB.

Figure 3:
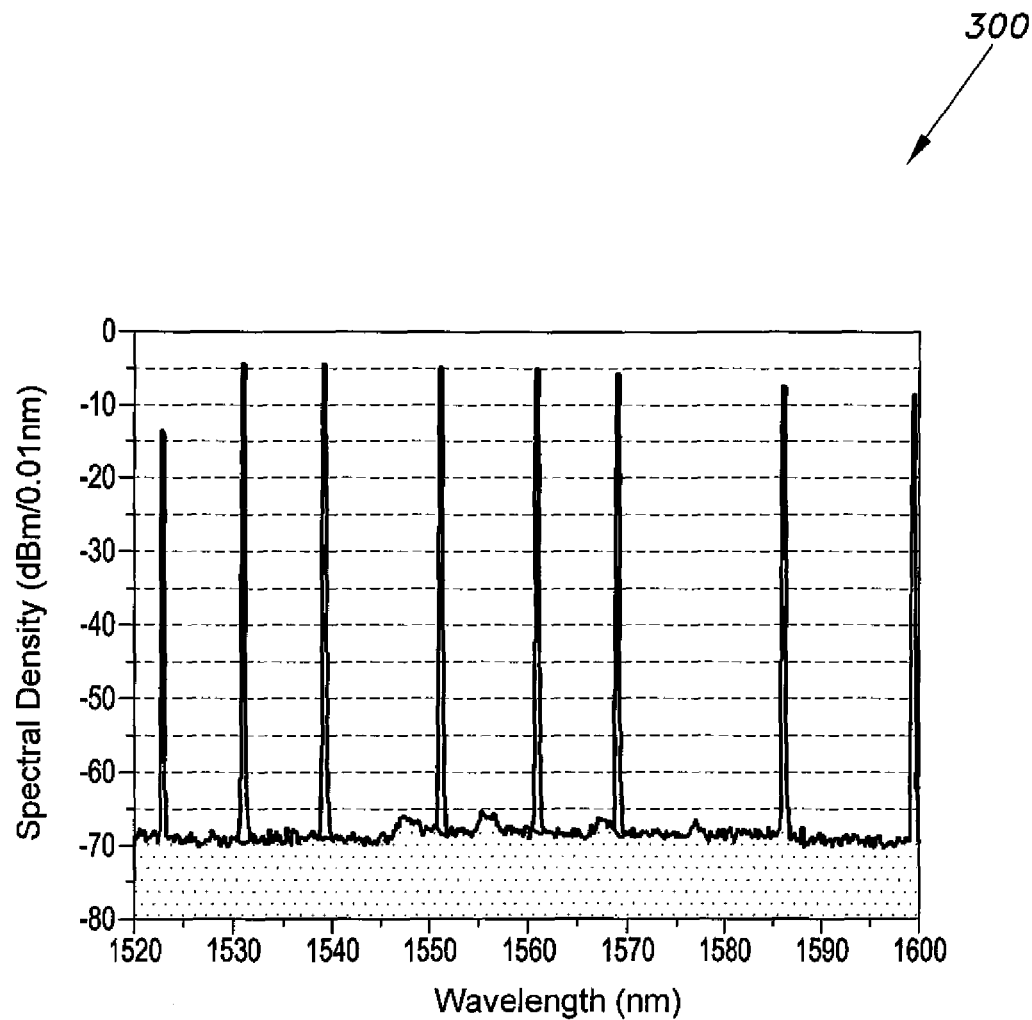
FIG. 3 is a spectral density plot showing tuning peaks of an embodiment of a GC-SOA equipped tunable fiber ring laser according to the present invention.

Plot 300 of FIG. 3 shows the superimposed optical spectra of an embodiment of a tunable fiber ring laser, such as the tunable fiber ring laser 12, while various external voltages were applied on the lead-zirconate titanate (PZT) film of the FFP-TF 16 in the tuning range of 1522 nm to almost 1600 nm. The output peak power is almost constant or substantially constant in the range from 1530 nm to 1570 nm. The measurements were performed with an optical spectrum analyzer (OSA), such as the OSA in FIG. 1, with a resolution of 0.01 nm, for example.

Figure 4:
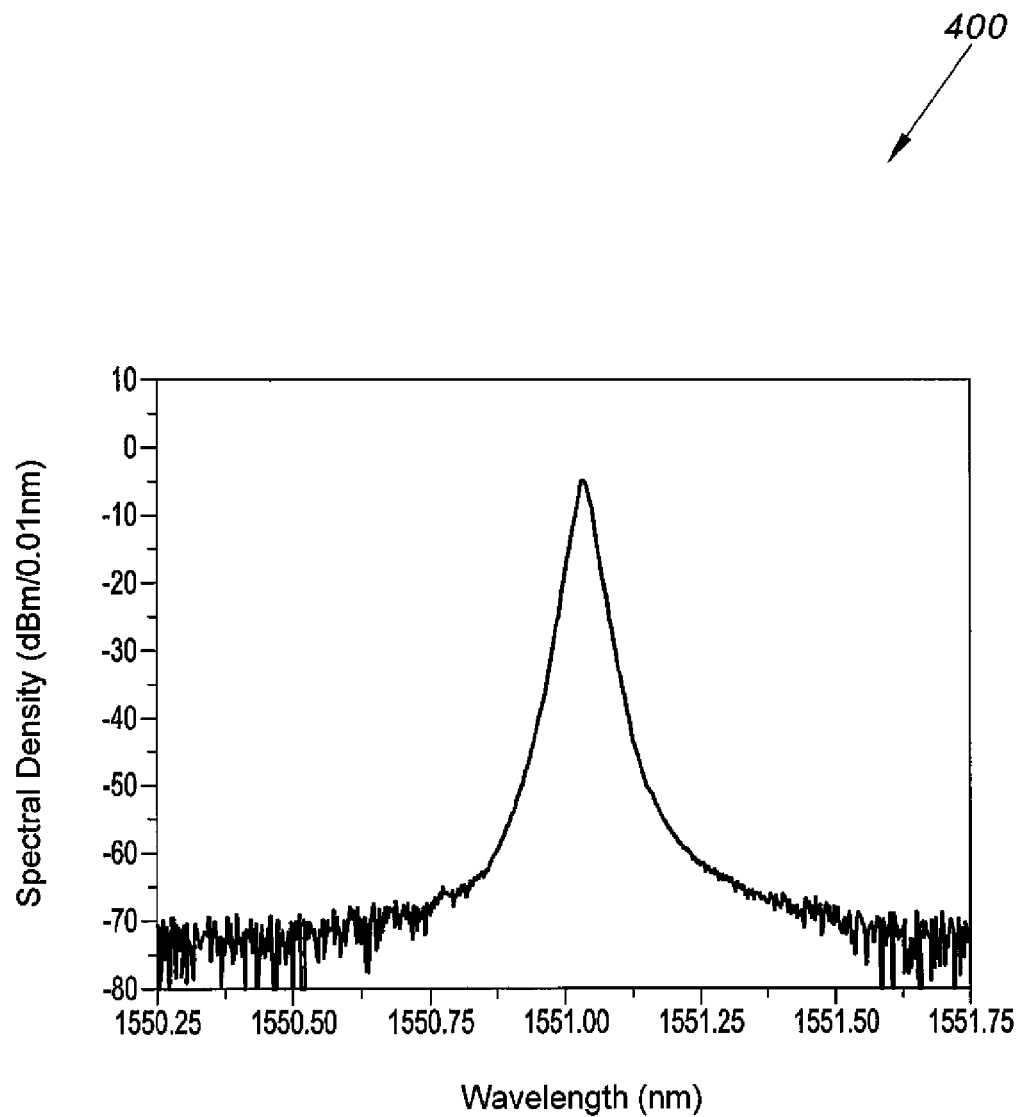
FIG. 4 is a spectral bandwidth plot of an embodiment of a GC-SOA equipped tunable fiber ring laser according to the present invention.

Referring to FIG. 4, a typical lasing spectrum of an embodiment of a tunable fiber ring laser, such as the tunable fiber ring laser 12, tuned at 1551.2 nm and measured at around 1551 nm is shown in plot 400 of FIG. 4. The asymmetric shape of the laser is mainly due to the response of the OSA. The laser has a 3-dB bandwidth of around 0.015 nm limited by the resolution of the OSA. The total output power of the laser is around −1 dBm, for example.

Figure 5:
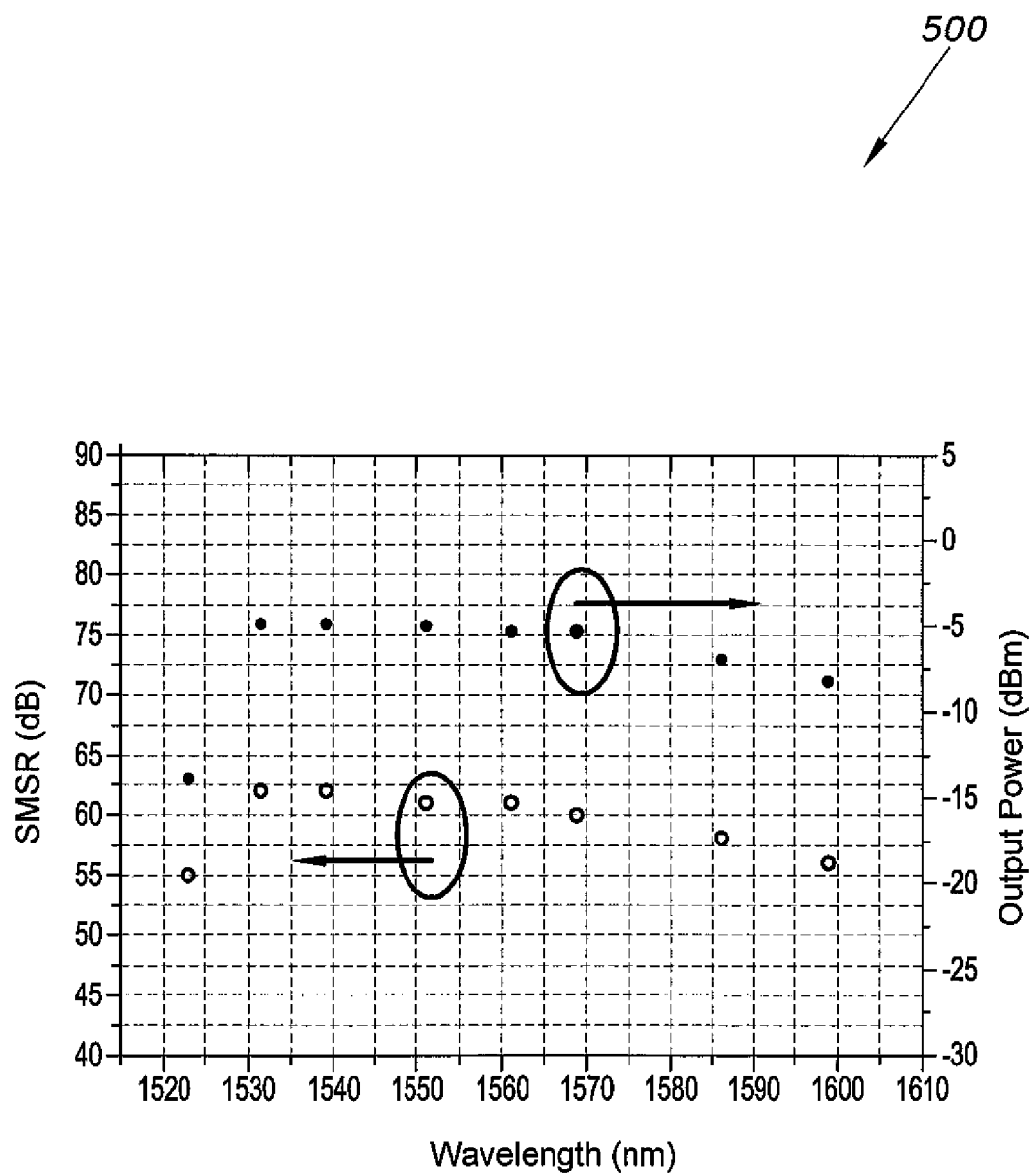
FIG. 5 is a SMSR versus Wavelength versus Output Power plot of an embodiment of a GC-SOA equipped tunable fiber ring laser according to the present invention.

Plot 500 of FIG. 5 shows the output power and the SMSR versus the tuning wavelength in the C+L band of the laser, such as the tunable fiber ring laser 12. The maximum and minimum output powers of −5 dBm and −15 dBm are observed at 1540 nm and 1522 nm, respectively. The maximum peak power variation of the laser is within 1 dB in the entire or substantially the entire C-band starting at 1530 nm and up to 1570 nm, for example.

The SMSR in the C-band is observed to be over 60 dB. However, outside this range, both the output power and the SMSR were reduced due to the smaller gain provided by the GC-SOA in an embodiment of a tunable fiber ring laser, such as the tunable fiber ring laser 12. The maximum and minimum SMSRs are 62.5 dB and 50 dB over the entire tuning range in the C+L band. This demonstrates that embodiments of a tunable fiber ring laser, such as the tunable fiber ring laser 12, can have a potential to be employed as a power equalized source in the C-band, for example.

In conclusion, embodiments of a tunable fiber ring laser with a gain clamped semiconductor optical amplifier can provide a widely tunable power equalized fiber ring laser using a GC-SOA. The embodiments of a tunable fiber ring laser are tunable from 1522 nm to around 1599 nm, for example, due to the relatively broad ASE generated by the GC-SOA in the embodiments of a tunable fiber ring laser. Also, embodiments of a tunable fiber ring laser have an advantage of a compact design along with an advantage of a relatively stable operation at room temperature. Further, embodiments of a tunable fiber ring laser can have potential applications in the WDM communication systems and fiber sensors, for example.

It is to be understood that the present invention is not limited to the embodiments described above, but encompasses any and all embodiments within the scope of the following claims.

I claim:

1. A tunable fiber ring laser with a gain clamped semiconductor optical amplifier, comprising:
   a fiber ring laser having an outer long cavity and an inner short cavity disposed within the outer long cavity;
   a pair of circulators disposed inside the inner short cavity;
   a fixed filter and a semiconductor optical amplifier (SOA) operably connected to the pair of circulators within the inner short cavity, the fixed filter providing a feedback path and combined with the SOA forming a gain-clamped semiconductor optical amplifier (GC-SOA) having an optical output directing first optical signals to the outer long cavity and an optical input accepting second optical signals from the outer long cavity;
   a polarization controller disposed in the outer long cavity and operably connected to a first circulator of the pair of circulators;
   a fiber Fabry-Perot Tunable Filter (FFP-TF) connected in-line with the polarization controller; and
   an optical coupler disposed in the outer long cavity, the optical coupler having an input and a split output, the input accepting an optical signal output from the FFP-TF,
   wherein a first portion of the split output from the optical coupler provides a tunable wavelength coherent beam emitted from the tunable fiber ring laser, and a second portion of the split output comprises optical signals retained in the inner short cavity and the outer long cavity via a second circulator of the pair of circulators.

2. The tunable fiber ring laser with a gain clamped semiconductor optical amplifier according to claim 1, wherein said pair of circulators is configured for causing light flowing inside said inner short cavity to flow in a counterclockwise direction and for causing light flowing inside said outer long cavity to flow in a clockwise direction.

3. The tunable fiber ring laser with a gain clamped semiconductor optical amplifier according to claim 2, wherein said optical coupler disposed in said outer long cavity is a 10% fused fiber coupler, the coupler retaining 90% of the light in said outer long cavity.

4. The tunable fiber ring laser with a gain clamped semiconductor optical amplifier according to claim 2, wherein said SOA includes a laser diode driver providing a biasing current.

5. The tunable fiber ring laser with a gain clamped semiconductor optical amplifier according to claim 4, wherein the biasing current is approximately 200 milli-amperes (mA).

6. The tunable fiber ring laser with a gain clamped semiconductor optical amplifier according to claim 2, wherein said FFP-TF has a pass-band tunable in a range of approximately 1530 nanometers (nm) to 1570 nm.

7. The tunable fiber ring laser with a gain clamped semiconductor optical amplifier according to claim 2, wherein said fixed filter has a 3 decibel (dB) bandwidth of 0.025 nanometers (nm) and is fixed at around 1532 nm to provide gain control.

8. The tunable fiber ring laser with a gain clamped semiconductor optical amplifier according to claim 2, wherein the tunable fiber ring laser is substantially continuously tunable over a 78 nanometer (nm) range of the C-Band and the L-band.

9. The tunable fiber ring laser with a gain clamped semiconductor optical amplifier according to claim 8, wherein said tunable fiber ring laser produces a power equalized output from 1530 nm to 1570 nm with a side-mode-suppression ratio (SMSR) of greater than 60 decibels (dB).

10. The tunable fiber ring laser with a gain clamped semiconductor optical amplifier according to claim 2, wherein said tunable fiber ring laser produces a power equalized output from 1530 nanometers (nm) to 1570 nm with a side-mode-suppression ratio (SMSR) of greater than 60 dB.

11. The tunable fiber ring laser with a gain clamped semiconductor optical amplifier according to claim 2, wherein said FFP-TF has an operable temperature range from −20 to +80 degrees centigrade (C) and a tuning Voltage/Free-Spectral-Range (FSR) in a range of from approximately 0 volts to 16 volts.

12. The tunable fiber ring laser with a gain clamped semiconductor optical amplifier according to claim 1, wherein said optical coupler disposed in said outer long cavity is a 10% fused fiber coupler, the coupler retaining 90% of the light in said outer long cavity.

13. The tunable fiber ring laser with a gain clamped semiconductor optical amplifier according to claim 1, wherein said SOA includes a laser diode driver providing a biasing current.

14. The tunable fiber ring laser with a gain clamped semiconductor optical amplifier according to claim 13, wherein the biasing current is approximately 200 milli-amperes (mA).

15. The tunable fiber ring laser with a gain clamped semiconductor optical amplifier according to claim 1, wherein said FFP-TF has a pass-band tunable in a range of approximately 1530 nanometers (nm) to 1570 nm.

16. The tunable fiber ring laser with a gain clamped semiconductor optical amplifier according to claim 1, wherein said fixed filter has a 3 decibel (dB) bandwidth of 0.025 nanometers (nm) and is fixed at around 1532 nm to provide gain control.

17. The tunable fiber ring laser with a gain clamped semiconductor optical amplifier according to claim 1, wherein the tunable fiber ring laser is substantially continuously tunable over a 78 nanometer (nm) range of the C-Band and the L-band.

18. The tunable fiber ring laser with a gain clamped semiconductor optical amplifier according to claim 17, wherein said tunable fiber ring laser produces a power equalized output from 1530 nm to 1570 nm with a side-mode-suppression ratio (SMSR) of greater than 60 decibels (dB).

19. The tunable fiber ring laser with a gain clamped semiconductor optical amplifier according to claim 1, wherein said tunable fiber ring laser produces a power equalized output from 1530 nanometers (nm) to 1570 nm with a side-mode-suppression ratio (SMSR) of greater than 60 decibels (dB).

20. A tunable fiber ring laser with a gain clamped semiconductor optical amplifier, comprising:
    a pair of circulators to determine a direction of a feedback light beam in the tunable fiber ring laser;
    a fixed filter and a semiconductor optical amplifier (SOA) operably connected to the pair of circulators, the fixed filter providing a feedback path and combined with the SOA forming a gain-clamped semiconductor optical amplifier (GC-SOA);
    a polarization controller operably connected to a first circulator of the pair of circulators;
    a fiber Fabry-Perot Tunable Filter (FFP-TF) connected in-line with the polarization controller to selectively tune a laser wavelength of the tunable fiber ring laser; and
    an optical coupler having an input and a split output, the input accepting an optical signal output from the FFP-TF,
    wherein a first portion of the split output from the optical coupler provides a tunable wavelength coherent beam emitted from the tunable fiber ring laser, and a second portion of the split output comprises optical signals retained in the tunable fiber ring laser via a second circulator of the pair of circulators.

\* \* \* \* \*